United States Patent [19]
Selley et al.

[11] Patent Number: 5,448,164
[45] Date of Patent: Sep. 5, 1995

[54] ELECTRICAL TEST APPARATUS AND METHOD OF CHECKING THE APPARATUS

[75] Inventors: Frederick W. Selley; Gary N. Denton, both of Kokomo; David A. Copp, Sharpsville; John D. Vote, Kokomo; Timothy B. Garrison, Tipton, all of Ind.

[73] Assignee: Delco Electronics Corp., Kokomo, Ind.

[21] Appl. No.: 996,761

[22] Filed: Dec. 24, 1992

[51] Int. Cl.[6] .............................................. G01R 31/28
[52] U.S. Cl. .................................. 324/158.1; 324/754; 371/25.1
[58] Field of Search ............. 324/158 F, 73.1, 158 R, 324/158.1, 754; 371/25.1

[56] References Cited

U.S. PATENT DOCUMENTS

| | | | |
|---|---|---|---|
| 2,122,499 | 7/1938 | Stocker | 315/392 |
| 2,171,216 | 8/1939 | Koch | 315/392 |
| 2,851,660 | 9/1958 | Tobin et al. | 324/73 |
| 3,039,604 | 6/1962 | Bickel et al. | 324/158 F |
| 3,665,504 | 5/1972 | Silverman | 324/158.1 |
| 4,656,417 | 4/1987 | Kirkpatrick et al. | 324/73 R |
| 4,762,663 | 8/1988 | Cook et al. | 376/259 |
| 4,965,865 | 10/1990 | Trenary | 324/158 P |
| 5,041,782 | 8/1991 | Marzan | 324/158 P |
| 5,055,778 | 10/1991 | Okubo et al. | 324/158 P |
| 5,066,907 | 11/1991 | Tarzwell et al. | 324/158 P |
| 5,084,673 | 1/1992 | Kazama | 324/158 P |

OTHER PUBLICATIONS

1971 Tektronix Catalog; Tektronix, Inc., Beaverton, Or.; pp. 281–283; 1971.

Primary Examiner—Ernest F. Karlsen
Attorney, Agent, or Firm—Robert J. Wallace; Jimmy L. Funke

[57] ABSTRACT

Apparatus for testing integrated circuit packages has a test circuit, a socket for receiving a standard circuit representing the packages being tested, and a special contact assembly for coupling to the packages being tested. Two sets of contacts in the assembly are permanently connected to the socket and the test circuit respectively, and one set is movable to connect with the other set or to terminals of a package being tested. A handler inserts the packages one at a time into the contact assembly and moves the movable set of contacts into circuit engagement with the package, and then the package is tested by the test circuit. The handler removes the package from the contact assembly and allows the movable set of contacts to engage the other set so that the standard circuit can be tested to verify that the test circuit is functioning correctly. Base data taken on the standard circuit is used to establish a significance band and data periodically taken on the standard circuit is compared with the significance band to determine the amount of drift in the test circuit.

4 Claims, 2 Drawing Sheets

ELECTRICAL TEST APPARATUS AND METHOD OF CHECKING THE APPARATUS

FIELD OF THE INVENTION

This invention relates to testing integrated circuit packages and particularly to a method and apparatus for verifying the accuracy of the test equipment during a sequence of testing a plurality of such packages.

BACKGROUND OF THE INVENTION

To assure product quality in the manufacture of integrated circuits it is desired to test each individual circuit. A common practice is to use test equipment which has a load board set up to test the specific type of circuit under test. A socket on the board for receiving the circuits under test is equipped with a plurality of contacts which are connected to the test circuit and which are moved by a solenoid actuator into contact with terminals on the IC package. The test equipment includes a handler which inserts each IC package into the socket for testing and removes it after the test.

In practice, cartridges or trays of IC packages of a given production lot are loaded into the test equipment and the packages are inserted one by one into the test station by the handler and a test is performed on each one to determine whether the packages meet specifications. To assure that the test circuit is performing properly the circuit is calibrated occasionally by manually inserting a pre-tested standard IC package of the same type as the lot being tested into the test station and running a test. This halts the normal production flow and production devices may be removed from the handler to prevent mixing with the standard device. If the device passes, the test system is confirmed as good and production flow resumes. If the device fails, interpretation of test results must be accomplished by qualified personnel. Finally, maintenance or calibration may be required. Checking the test system in this manner is done only after a problem is discovered or at scheduled calibration intervals. Typically, such a test is performed at the beginning and end of each production lot or at the start of the work day.

Shortcomings of this practice are:
1) A problem is not detected as it drifts into being. It is detected only after it has become serious.
2) A separate manual cycle of intervention and device handling is required.
3) Interpretation of test results is required.
4) Usually an unknown number of devices are involved. This may allow marginal or bad parts to the released.

SUMMARY OF THE INVENTION

It is therefore an object of the invention to check IC package testing equipment frequently and without interruption of production flow, and without manual intervention and device handling. Another object is to calibrate the system to allow determination of the significance of any variance in tests of the standard device.

The invention is carried out by modifying the previous test equipment to permit the standard device to be kept in place throughout the production testing so that the performance of the test equipment can be verified without manual intervention or handling and without interruption of production flow.

The load board which simulates the operating environment of the IC packages during the test is provided with a dedicated socket for receiving the standard device so that the standard can be mounted in the socket and remain there without interfering with the devices under test. The load board is connected to a separate automatic tester. The testing station on the load board is equipped with two sets of contacts. One set is stationary and is connected to the socket of the standard device. The other set is coupled to the testing circuitry and is movable between first and second positions contacting the first set and alternatively contacting the terminals of the device under test, thereby acting as a gang switch. Accordingly, in the first position the standard device is connected to the test circuit and in the second position the device under test is connected to the test circuit.

The handler loads the devices under test into the testing station and moves the second set of contacts from contact with the first set and into contact with the device. When the device is thus connected to the test circuit the test is executed. Then the handler removes the device from the test station and returns the second set of contacts into engagement with the first set, thereby coupling the standard device to tile testing circuit.

The standard device can be tested while other devices are being changed in the test station to verify the testing circuit as often as desired and with no interruption of the production flow. In this way no manual intervention takes place, saving time and reducing the possibility of human error. Frequent checking results in savings by finding a problem before it affects unknown quantities of material, and yield improves due to constant monitoring of machine quality.

The standard circuit, when it is first qualified, is tested to acquire sufficient data on its operation to establish a significance band in the data. Then data from subsequent tests of the standard are compared to the significance band to determine if a significant drift has occurred.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
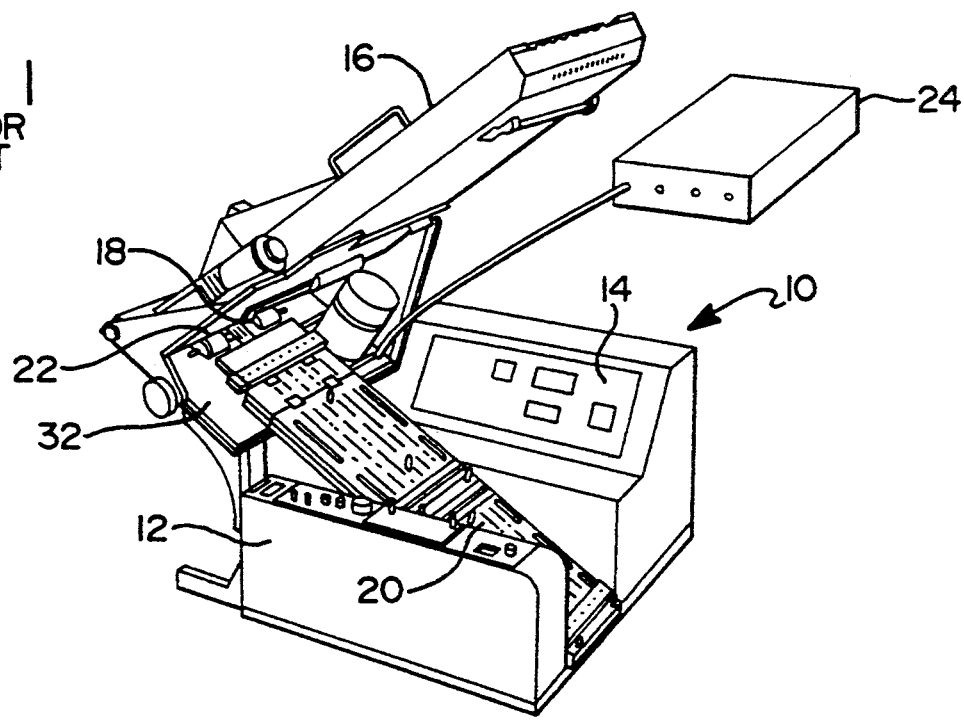
FIG. 1 is an isometric view of conventional test apparatus which is to be modified by the invention.
Figure 2:
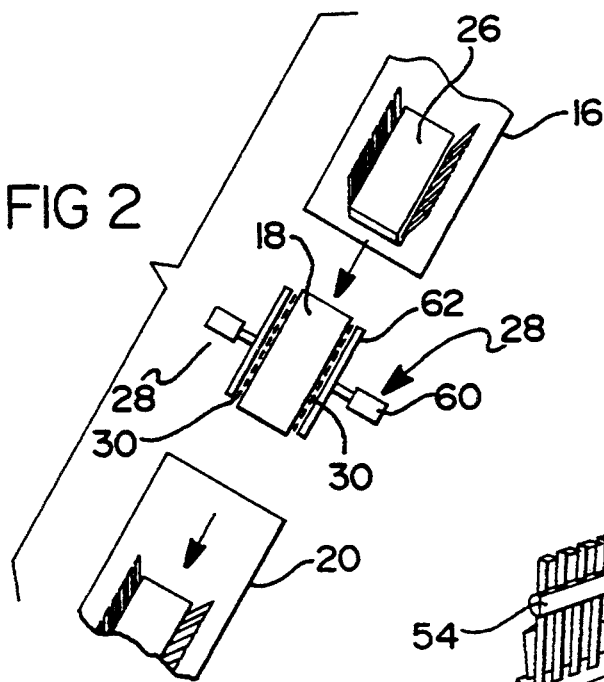
FIG. 2 is a schematic view of a handler and test station of the apparatus of FIG. 1 and a device to be loaded into the station.

FIG. 1 illustrates test apparatus 10 which, except for the invention described herein, is commercially available. The apparatus has a control console 12 at one side and a display panel 14 at the other side. An upper inclined tray 16 feeds devices under test to a testing station 18 and a lower inclined tray 20 receives devices discharged from the test station 18. The trays and the test station are positioned between the console 12 and the display panel 14. A handler 22, shown schematically in FIG. 2, includes a gravity feed mechanism which delivers a device 26 from the upper tray 16 to the testing station 18, and deposits the device 26 on the tray 20 after the test. The handler also includes a solenoid operated mechanism 28 for closing contacts 30 of the test apparatus with terminals of the device 26 under test. A load board 32 is mounted below the handler 22. An automatic tester 24 is connected by a cable to the load board. The automatic tester 24 is a commercially available device which tests the device 6 as it is being loaded by the load board to simulate operating conditions.

Figure 3:
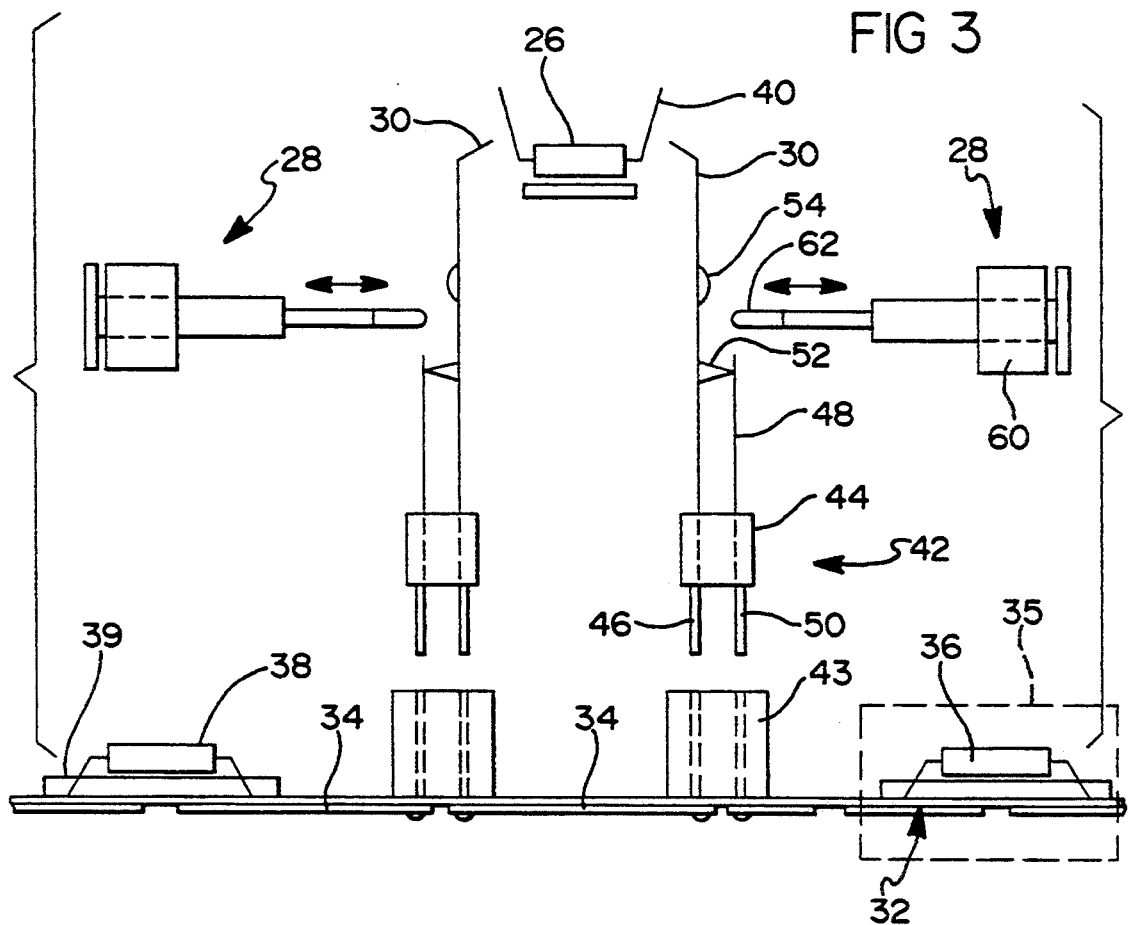
FIG. 3 is a schematic view of contactor assembly and load board according to the invention.

In FIG. 3 the load board 32 is represented by a printed circuit board having conductor traces 34, a load circuit 35 including a representative component 36 for loading the circuit being tested, and a standard IC circuit 38 of the same type as the device 26 under test. The standard package 38 may be permanently secured to the load board 32 or inserted into a socket 39 which is secured to the board. For purposes of illustration, the device under test 26 is represented by a dual inline package having leads or terminals 40. Each lead 40 is aligned with a contact 30 of the test apparatus. The contacts 30 are part of two contactor assemblies 42, one on each side of the device 26 forming two opposed gangs of contacts 30. Female connectors 43 mounted on the board 32 and coupled to the traces 34 receive the contactor assemblies 42.

Figure 5:
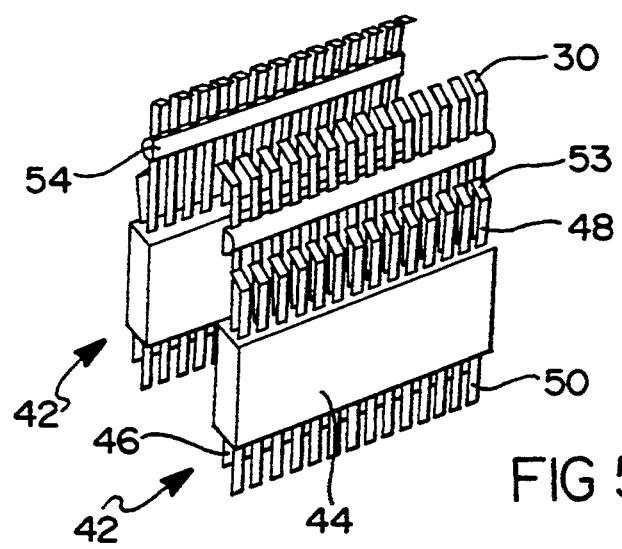
FIG. 5 is an isometric view of the contactor assembly of FIG. 3.
Figure 4:
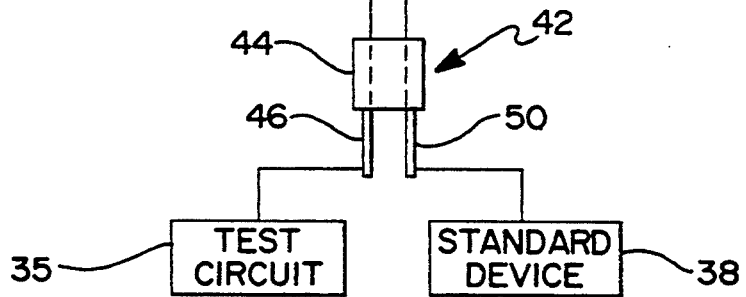
FIG. 4 is a partial view of the contactor assembly of FIG. 3 with contacts in actuated position.

Each of the contactor assemblies 42, also shown in FIGS. 4 and 5, comprises a connector block 44 holding a row or gang of flexible blade contacts 30 which extend from the upper side of the block and associated terminal pins 46 which extend from the lower side of the block. A plurality of short contact blades 48 parallel to the row of contacts 30 and paired with the contacts 30 also extend from the upper side of the block and have associated terminal pins 50 depending from the lower side of the block 44. The terminal pins 46 and 50 comprise a male connector for coupling with a corresponding female connector 43. The short contact blades 48 are each normally connected by a contact pad 52 to a corresponding contact 30. The pads 52 are secured to either of the blades. Instead of pads 52, the short contact blades may have an inturned upper tip 53 which contacts the associated blade 30, as shown in FIG. 5. A long insulating tie bar 54 mechanically connects the contacts 30 for movement together. Preferably the flexible contact blades 30 are spring biased into contact with the short contacts 48 to make an electrical connection between blade pairs in the normal contact position.

The solenoid mechanism 28 for operating the contacts comprises a solenoid actuator 60 laterally spaced from each set of contactor assemblies 42. Each mechanism includes a pusher bar 62 movable into engagement with the flexible contacts 30 for pushing those contacts against their bias away from the short contact blades 48 and into electrical contact with the corresponding leads 40 of the device under test, thereby gang switching the contactor assembly. In the rest position of the solenoid actuator the pusher bar is retracted, allowing the normal position of the blades 30, wherein they contact the short contact blades 48, and the test circuit 35 of the load board is coupled to the standard device 38. When the solenoid mechanism is actuated the blades 30 are switched to couple the test circuit to the device under test 26, as shown in FIG. 4.

In operation, the standard device is normally connected to the test circuit via the contactor assemblies 42, and at that time the devices under test are changed in the test station and, if desired, a test is run on the standard device. The test on the standard device is run to verify the complete electrical test circuit including the automatic tester 24, cabling, and the load board 32. When a new device is installed in the test station, the solenoid mechanism is actuated to switch the contactor assemblies to disconnect the standard device from the test circuit and to connect the device under test to the test circuit. Then the device under test is loaded by the load board and tested by the automatic tester 24 and the results compared to calibration values to determine whether the device is within specifications.

The standard device or circuit is originally tested to collect initial test data. The test data is analyzed to establish a band of significance which sets the bounds for acceptable drift of the test circuitry. Then each time the standard device is tested it can be immediately determined whether the test circuit itself is within specifications and whether it is approaching the bounds.

For the testing of a production lot of IC packages the standard circuit is mounted to the load circuit only once. During the testing the standard circuit may, if desired, be tested each time a device under test is removed, although it is more likely that many of the production devices will be tested for each test of the standard. The testing of the standard for verifying the testing circuitry may be at fixed time intervals or after predetermined numbers of production devices are tested.

The embodiments of the invention in which an exclusive property or privilege is claimed are defined as follows:

1. An apparatus for testing integrated circuit devices, the apparatus having test circuitry and a self-check capability to determine whether the test circuitry is functioning correctly, comprising:
   a contact assembly for receiving a device under test;
   device handling means for automatically and sequentially locating each of a plurality of the integrated circuit devices in the contact assembly for testing;
   a mounting means for receiving a standard integrated circuit which is equivalent to the device under test;
   wherein the contact assembly comprising a first set of contacts electrically coupled to the mounting means for connection with the standard circuit, and a second set of contacts connected to the test circuitry and movable between a first position for engaging the first set of contacts and a second position for engaging the device under test, wherein the second set of contacts spring biased toward the first position;
   contact operating means for automatically moving the second set of contacts from the first position to the second position and into engagement with each device under test when in the contact assembly, and for automatically allowing the second set of contacts to move to the first position when no device under test is in the contact assembly;
   whereby the test circuitry is coupled to either the mounting means for the standard integrated circuit for verifying the test circuitry or to each device under test when in the contact assembly.

2. The invention as defined in claim 1 wherein the second set of contacts comprises at least one gang of contacts coupled to a common push bar for movement together between first and second positions.

3. The invention as defined in claim 1 wherein the second set of contacts comprises two opposed gangs of contacts for engaging the terminals of a dual inline package, each gang being coupled to a push bar for movement together between first and second positions.

4. The invention defined in claim 1 wherein
the contact operating means comprises a solenoid actuator having a rest position which allows the second set of contact to move to the first position when no device under test is in the contact assembly, so that the test circuit will be coupled to the mounting means for the standard integrated circuit and an actuated position which moves the second set of contacts into engagement with the device under test.

* * * * *